United States Patent [19]

Traa

[11] Patent Number: 4,794,275

[45] Date of Patent: Dec. 27, 1988

[54] MULTIPLE PHASE CLOCK GENERATOR

[75] Inventor: Einar O. Traa, Portland, Oreg.

[73] Assignee: Tektronix, Inc., Beaverton, Oreg.

[21] Appl. No.: 98,110

[22] Filed: Sep. 17, 1987

[51] Int. Cl.$^4$ .................. H03K 5/13; H03K 17/00; H03K 23/54; H03K 19/00

[52] U.S. Cl. .................. 307/269; 307/510; 307/480; 307/262; 328/72; 328/155; 377/124; 377/126; 377/129

[58] Field of Search .............. 307/269, 262, 510, 511, 307/480, 479, 454, 455, 456, 466, 467, 582; 328/55, 62, 63, 75, 72, 155; 377/124, 126, 129, 72, 76, 78, 122

[56] References Cited

U.S. PATENT DOCUMENTS

| 3,243,728 | 3/1966 | Brainerd et al. | 377/126 |
|---|---|---|---|
| 3,329,834 | 7/1967 | Klinikowski | 377/122 |
| 4,542,301 | 9/1985 | Narabu | 307/269 |
| 4,700,350 | 10/1987 | Douglas et al. | 307/269 |

Primary Examiner—Stanley D. Miller
Assistant Examiner—Trong Q. Phan
Attorney, Agent, or Firm—Daniel J. Bedell; John P. Dellett; Robert S. Hulse

[57] ABSTRACT

A multiple phase clock generator includes a ring of an even number of phase cells, each phase cell generating a separate phased clock signal. Each phase cell supplies its phased clock signal and a prebias output signal in response to concurrent assertion of an enable signal and a prebias output signal from a preceding phase cell on the ring. Enable signals supplied to each phase cell around the ring are asserted and deasserted in response to state changes in a master clock signal, enable signals supplied to non-adjacent phase cells being provided concurrently. When initialized with one phase cell asserting its phased clock signal and prebias output signal, each transition of the master clock signal causes a next phase cell on the ring to supply its phased clock output signal.

18 Claims, 3 Drawing Sheets

MULTIPLE PHASE CLOCK GENERATOR

BACKGROUND OF THE INVENTION

The present invention relates generally to clock signal generation and particularly to an apparatus for generating a plurality of phased clock signals.

Phased clock signals have similar periods but differing phase relationships and are useful in synchronizing the orderly and controlled flow of data in a digital system. As data signals propagate through a network, they undergo delays that cannot be precisely predicted. By clocking data flow in a digital system, it is possible to insure that at a given time a particular data signal may be safely interpreted as having reached a valid logical level. Multiple phase clock signals have been produced by passing a master clock signal through a multiple tap delay line. However, such delay lines are expensive and cannot be implemented in integrated circuit form. Multiple clock phase generators utilizing digital delay elements have been used, but they typically do not operate at high frequencies.

SUMMARY OF THE INVENTION

In accordance with one aspect of the present invention, a plurality of high frequency phased clock signals are generated by a multiple phase clock generator comprising a set of even phase cells and a set of odd phase cells. Each phase cell includes an enable input for receiving an enable signal, a prebias input for receiving a prebias input signal, a prebias output for providing a prebias output signal, and a clock output for providing one of the phased clock signals. The phased clock signal and prebias output signal of a phase cell are asserted when both its enable and prebias input signals are asserted. Once the phased clock and prebias output signals of a phase cell are asserted, they remain asserted until the enable signal is deasserted.

The phase cells are organized in a phase cell ring with even phase cells interposed between odd phase cells by connecting the prebias output of each phase cell to the prebias input of an adjacent phase cell, each phase cell thereby providing its prebias output signal as the prebias input signal to its neighbor. The enable inputs of all even phase cells are connected to an "even" circuit node while the enable inputs of all odd phase cells are connected to an "odd" circuit node. An enable signal is alternately applied to the even node and odd node in accordance with the state of a master clock signal so as to alternately apply the enable signal to the enable inputs of the even phase cells and the odd phase cells. When operation of the multiple clock phase generator is initiated with a single phase cell asserting its phased clock signal and prebias output signal, the master clock signal causes successive assertion of phased clocked signals at the clock outputs of successive phase cells around the phase cell ring.

Each odd phase cell and each even phase cell includes a three-emitter transistor for producing the phased clock signal, the prebias output signal, and a feedback signal at each emitter in response to assertion of a control signal applied to the transistor's base. An input stage asserts the control signal upon concurrent assertion of the enable signal and the prebias input signal and upon concurrent assertion of the enable signal and the feedback signal.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

DETAILED DESCRIPTION

Figure 1:
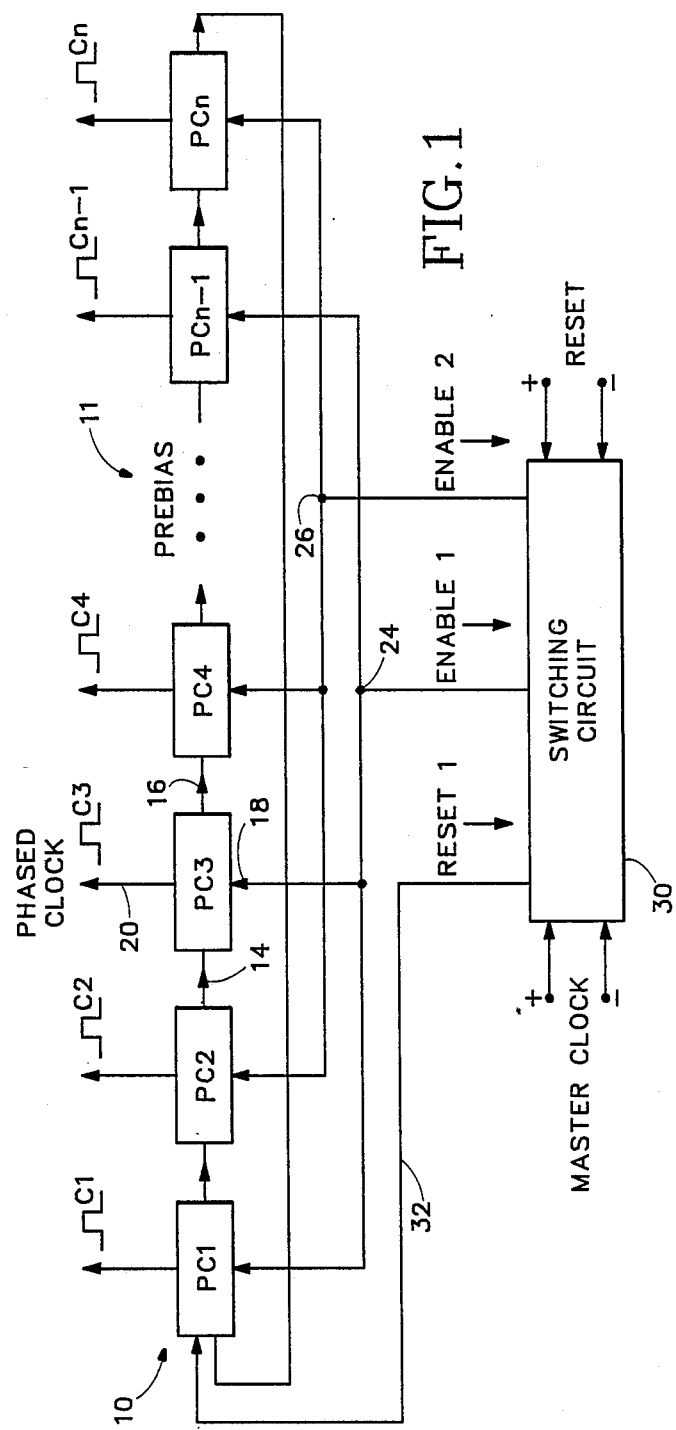
FIG. 1 is a block diagram of a multiple phase clock generator according to the present invention.
Figure 2:
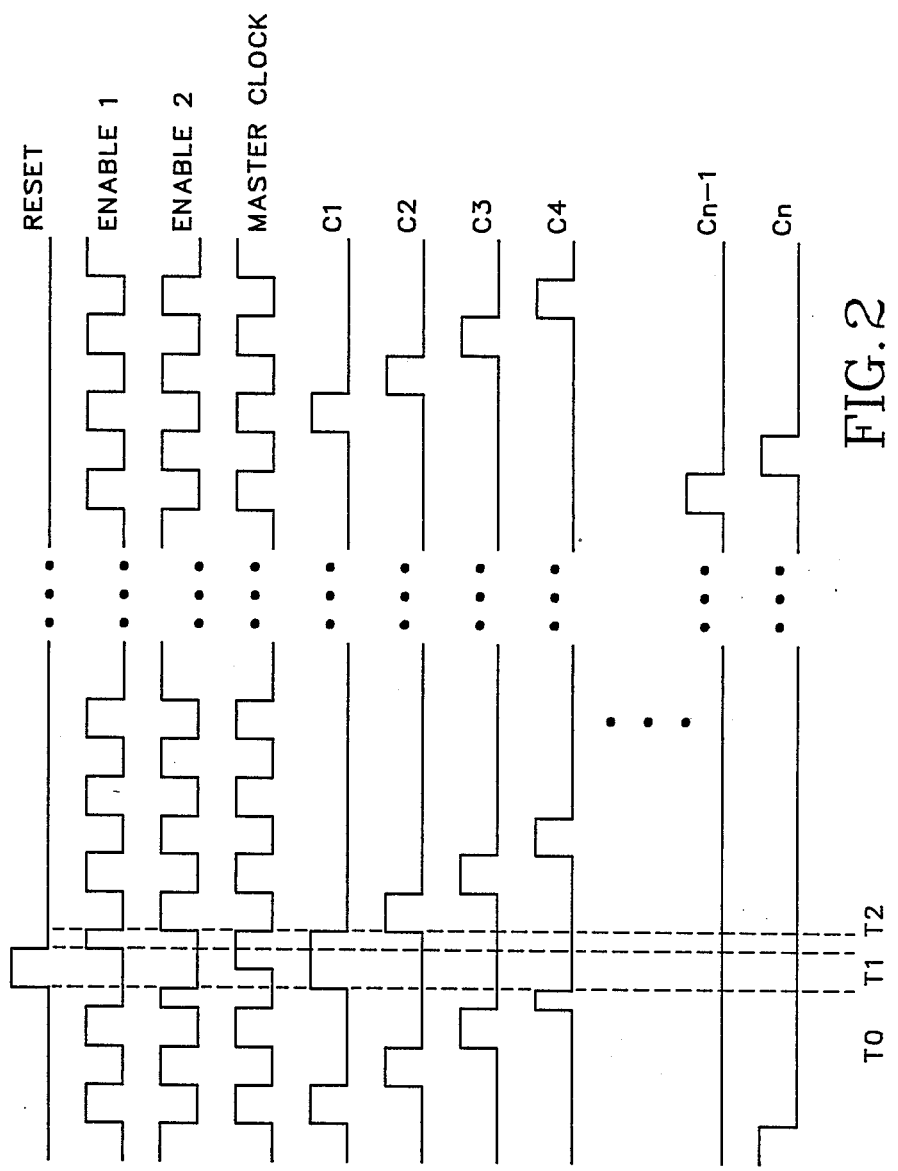
FIG. 2 is a timing diagram of operation of the multiple clock phase generator of FIG. 1.

With reference to FIGS. 1 and 2, a multiple phase clock generator in accordance with the present invention includes an even numbered plurality of phase cells 10, individually labeled PC1 through PCn, which generate a corresponding plurality of PHASED CLOCK output signals, C1 through Cn. Each of the phase cells 10 includes a prebias input 14 for receiving a PREBIAS input signal, a prebias output 16 for providing a PREBIAS output signal, an enable input 18 for receiving an ENABLE signal, and a clock output 20 for providing a PHASED CLOCK signal. The PHASED CLOCK and PREBIAS output signals of each phase cell 10 are asserted when its PREBIAS input signal and its ENABLE input signal are concurrently presented. When a phase cell asserts its PHASED CLOCK output signal and PREBIAS output signal, internal feedback maintains assertion of the PHASED CLOCK signal and PREBIAS output signal until the ENABLE signal is deasserted. Thus, for each of the phase cells 10, the PREBIAS and ENABLE input signals must be asserted concurrently to initiate the PHASED CLOCK and PREBIAS output signals; however, continued assertion only of the ENABLE signal at the enable input 18 is essential to subsequently maintain the PHASED CLOCK and PREBIAS output signals.

The phase cells 10 form a serially linked phase cell ring 11 wherein the prebias output 16 of the kth phase cell PCk is connected to the prebias input 14 of the (k+1)th phase cell PCk+1, with the prebias output 16 of phase cell PCn being connected to the prebias input 14 of phase cell PC1. Thus, for example, phase cell PC3 provides its PREBIAS output signal as the PREBIAS input signal to phase cell PC4. The enable inputs 18 of odd labeled phase cells 10 (PC1, PC3, ..., PCn−1) are connected to an "odd" node 24 while the enable inputs 18 of even labeled phase cells 10 (PC2, PC4, ..., PCn) are connected to an "even" node 26. A differential MASTER CLOCK signal is applied to a switching circuit 30 employed to alternately assert an ENABLE1 signal at the odd node 24 and an ENABLE2 signal at the even node 26 in response to changes in the state of the MASTER CLOCK.

A multiple phase clock generator similar to that disclosed and claimed herein is also disclosed in the co-pending application of Hans-Jurg Greub, Ser. No. 084,003, filed Aug. 7, 1987, entitled HIGH SPEED, PARTITIONED REDUCED INSTRUCTION SET COMPUTER.

The multiple phase clock generator is initialized by a differential RESET signal applied to the switching circuit 30. As will be discussed in greater detail hereinafter, assertion of the RESET signal causes phase cell PC1 to provide its PHASED CLOCK and PREBIAS output signals and prevents the remainder of the phase cells 10 from supplying their PHASED CLOCK and PREBIAS output signals. Immediately upon deassertion of the RESET signal, phase cell PC1 is the only phase cell with PHASED CLOCK and PREBIAS output signals, and phase cell PC2 is the only phase cell having a PREBIAS input signal. When the switching circuit 30 next asserts the ENABLE2 signal at even node 26, phase cell PC2 initiates and maintains its PHASED CLOCK output signal C2 and PREBIAS output signal. At the same time, phase cell PC1 deasserts its PHASED CLOCK and PREBIAS output signals, phase cell PC1 being no longer in receipt of an ENABLE1 signal via the odd node 24. At the next state transition of the MASTER CLOCK signal, phase cell PC3, then being in receipt of a PREBIAS input signal from phase cell PC2 and in receipt of an ENABLE1 signal via odd node 24, provides its PHASED CLOCK and PREBIAS output signals. Phase cell PC2 then discontinues its output signals. At each subsequent transition of the MASTER CLOCK, the next member of the phase cells 10 on the phase cell ring 11 asserts its PHASED CLOCK and PREBIAS output signals while the remaining phase cells deassert their output signals. The process continues as long as the MASTER CLOCK signal operates, or until the RESET signal is reasserted.

As illustrated in FIG. 2, the kth PHASED CLOCK signal Ck is provided immediately following the (k−1)th PHASED CLOCK signal Ck−1, and PHASED CLOCK signal C1 is supplied immediately following PHASED CLOCK signal Cn. The PHASED CLOCK signals C1 through Cn operate at the same frequency, $2f_{CLK}/n$, where $f_{CLK}$ is the frequency of the MASTER CLOCK signal, but the PHASED CLOCK signals are of differing phase with respect to one another. The duty cycle of odd labeled PHASED CLOCK signals is equal to the duty cycle of the MASTER CLOCK, and the duty cycle of even labeled PHASED CLOCK signals is the complement of the duty cycle of the MASTER CLOCK signal.

Upon presentation of the RESET signal, the PHASED CLOCK signal C1 is asserted and all other PHASED CLOCK signals are discontinued despite the state of the MASTER CLOCK signal. In the particular example shown in FIG. 2, as the RESET signal is asserted at time T∅, C1 is provided and C4 is deasserted, even though in the absence of a reset condition the ENABLE2 signal would be asserted. The RESET signal is preferably returned to negative at a time T1 when the MASTER CLOCK signal is high so that the sequence of PHASED CLOCK signals C2 through Cn begins at a known time T2, the next transition of the MASTER CLOCK signal. If the RESET signal is deasserted when the MASTER CLOCK signal is low, switching circuit 30 would be asserting the ENABLE2 signal and would cause phase cell PC2 to immediately supply its PHASED CLOCK output signal C2 rather than at the next transition of the MASTER CLOCK signal. Thus, in such case, the duration of the first C2 signal would be abnormally short.

Figure 3:
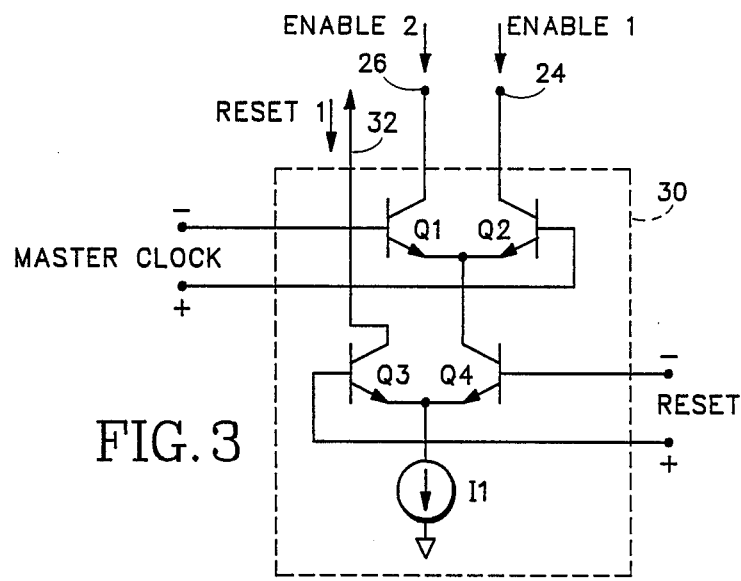
FIG. 3 is a schematic diagram of a switching circuit employed in the circuit of FIG. 1.

Referring now to FIG. 3, switching circuit 30 comprises a two-stage current tree having a current source I1, a first emitter-coupled transistor pair Q1, Q2, and a second emitter-coupled transistor pair Q3, Q4. The collector of transistor Q1 is connected to even node 26 and the collector of transistor Q2 is connected to odd node 24. The differential MASTER CLOCK signal is applied across the bases of transistors Q1 and Q2. The collector of Q3 is connected via line 32 to a reset input of phase cell PC1 of FIG. 1, while the collector of Q4 is connected to the emitters of transistor pair Q1, Q2. The emitters of transistor pair Q3, Q4 are coupled to ground through the current source I1, and the differential RESET signal is applied across their bases.

During normal operation, the RESET signal, being negative, turns transistor Q4 on and transistor Q3 off. As the MASTER CLOCK signal changes state, the current source I1 alternately provides ENABLE1 and ENABLE2 current signals through even node 26, via transistors Q1 and Q4, and through odd node 24, via transistors Q2 and Q4. During reset, the RESET signal, being positive, turns transistor Q4 off and transistor Q3 on, thereby decoupling the current source I1 from both the even node 26 and the odd node 24 such that none of the phase cells 10 receive an ENABLE1 or ENABLE2 signal. Rather, the current from current source I1 is supplied as a RESET1 current signal to a reset input of phase cell PC1 of FIG. 1 by way of transistor Q3 and line 32.

Figure 4:
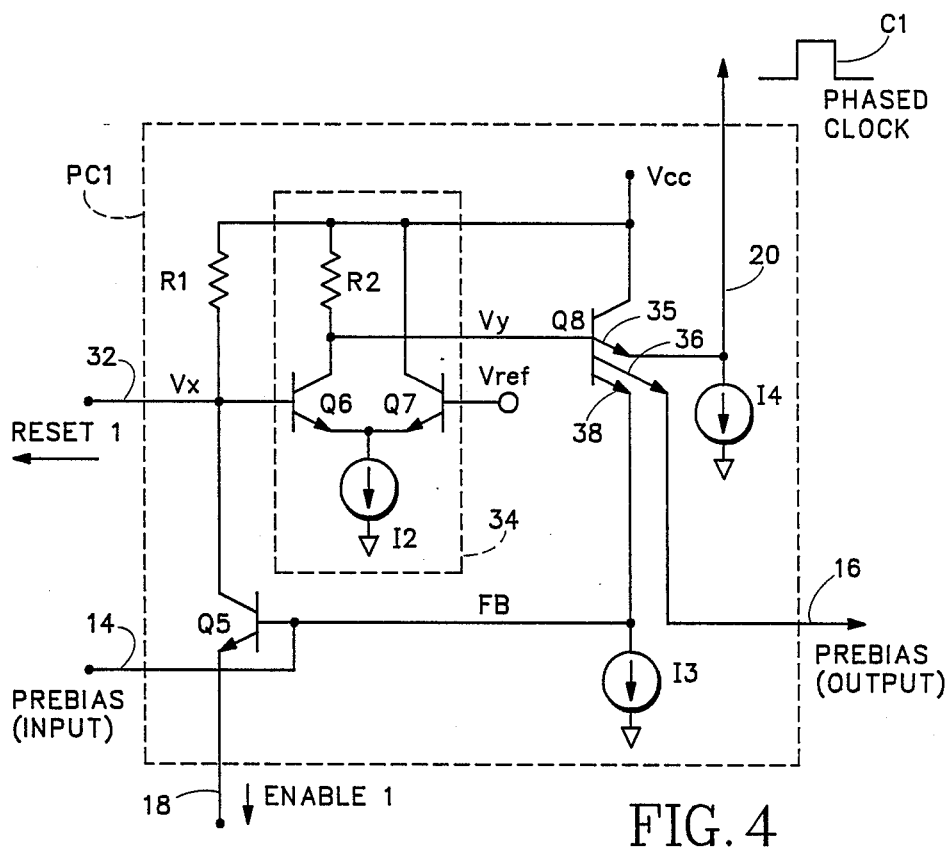
FIG. 4 is a schematic diagram of a phase cell utilized in the circuit of FIG. 1.

In reference to FIG. 4, detailing phase cell PC1, the prebias input 14 is connected to the base of a transistor Q5, the enable input 18 is connected to the emitter of transistor Q5, and a voltage source Vcc is coupled to the collector of transistor Q5 via a resistor R1. A current source I3 couples the base of transistor Q5 to ground. When the ENABLE1 current signal is not asserted, a voltage Vx at the collector of transistor Q5 is nearly equal to Vcc, there being insufficient current through R1 to provide a substantial voltage drop across resistor R1. When the PREBIAS input signal is asserted at the base of transistor Q5 concurrently with the ENABLE1 current signal, transistor Q5 turns on and conducts the ENABLE1 current through R1. A voltage drop occurs in Vx at the collector of transistor Q5 due to the passage of ENABLE1 current through resistor R1. Thus, the voltage Vx present at the collector of transistor Q5 is a function of the signals received at the prebias input 14 and the enable input 18, and, as will be seen, is determinative of the phase cell state.

A comparator 34 detects the change in voltage Vx at the collector of transistor Q5 by comparing Vx to a reference voltage $V_{ref}$. Comparator 34 suitably includes an emitter-coupled transistor pair Q6, Q7, a resistor R2, and a current source I2. The emitters of transistor Q6 and transistor Q7 are coupled to ground through the current source I2, the base of transistor Q6 is connected to the collector of transistor Q5, and the base of transistor Q7 is connected to $V_{ref}$. The collector of transistor Q7 is tied to Vcc, while the collector of transistor Q6 is coupled to Vcc via the resistor R2. An output voltage Vy of comparator 34 appears at the collector of transistor Q6. The potential of $V_{ref}$ is set between the maximum and minimum of Vx so that when Vx is low, Vy is high, and when Vx is high, Vy is low.

The output voltage Vy of the comparator 34 drives the base of a multi-emitter transistor Q8. A first emitter 35 of the transistor Q8 is coupled to ground through a current source I4. When the base of transistor Q8 is high, it drives high (asserts) the PHASED CLOCK signal at the first emitter 35, the PREBIAS output signal at a second emitter 36, and a feedback signal (FB) at a third emitter 38. The feedback signal FB applied to the base of transistor Q5 keeps Q5 on after the PREBIAS input signal is deasserted, until the ENABLE1 current signal is turned off. When the ENABLE1 current signal is turned off on the next transition of the MASTER CLOCK signal, transistor Q5 turns off and its collector potential Vx rises above Vref. Transistor Q6 turns on, pulling down its collector potential Vy, which in turn drives the base of transistor Q8 low, pulling down its C1, FB and PREBIAS output signals.

In reference to FIGS. 1, 3 and 4, the RESET1 current signal input to the phase cell PC1 from switching circuit 30 on the line 32 causes the phase cell PC1 to provide its PHASED CLOCK and PREBIAS output signals during a reset operation. As previously discussed, a positive RESET signal decouples the enable inputs 18 of all the phase cells 10 from the current source I1 and couples line 32 to the current source I1 so as to assert the RESET1 signal at the base of transistor Q6 of the phase cell PC1. The RESET1 signal current is transmitted through the resistor R1 of the phase cell PC1 and causes a drop in the voltage Vx of the phase cell PC1. The drop in Vx is detected by the comparator 34 causing the comparator to drive the base of transistor Q8 high, thereby causing phase cell PC1 to present its PHASED CLOCK and PREBIAS output signals. During this reset operation, the remainder of the phase cells 10 are prevented from supplying their PHASED CLOCK and PREBIAS output signal because both the ENABLE1 and ENABLE2 signals are deasserted.

Referring now to FIGS. 1-4 for a description of overall operation, the multiple phase clock generator is first reset by assertion of the RESET signal causing the phase cell PC1 to supply its PHASED CLOCK and PREBIAS output signals while the remainder of the phase cells 10 deassert their PHASED CLOCK and PREBIAS output signals. The RESET signal is then deasserted when the MASTER CLOCK signal is high, and upon the next transition of the MASTER CLOCK signal, the ENABLE2 signal is provided. Only phase cell PC2 will then supply its PHASED CLOCK and PREBIAS output signals, because only phase cell PC2 has asserted ENABLE2 and PREBIAS input signals. At the same time, phase cell PC1 discontinues its PHASED CLOCK and PREBIAS output signals, phase cell PC1 being no longer in receipt of an ENABLE1 signal. The process continues at the next MASTER CLOCK signal transition when the phase cell PC3, being in receipt of PREBIAS and ENABLE1 input signals, provides its PHASED CLOCK and PREBIAS output signals. Phase cell PC2 deasserts its PHASED CLOCK and PREBIAS output signals in response to deassertion of the ENABLE2 signal. In similar fashion, subsequent transitions in the MASTER CLOCK signal cause successive phase cells 10 on the phase cell ring 11 to successively assert and deassert their PHASED CLOCK and PREBIAS output signals in the manner depicted in FIG. 2.

An apparatus for producing multiple phased clock signals has been shown and described comprising a ring of phase cells, each phase cell producing a separate phased clock signal when enabled. The cells around the ring are successively enabled by enable signals produced in response to state changes in a master clock signal so that the phase clock signals are all of the same frequency but of differing phase relation one to another. The multiple phase clock generator of the present invention is easily implemented in integrated circuit form and is operable at very high frequencies.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A multiple phase clock generator for producing a plurality of phased clock signals in response to a master clock signal, the multiple phase clock generator comprising:

enabling means for alternatively asserting a first and a second enable signal in response to changes in state of said master clock signal;

a plurality of odd phase cells each providing a separate one of said plurality of phased clock signals and a separate prebias output signal in response to concurrent assertion of said first enable signal and a prebias input signal; and a plurality of even phase cells each providing a separate one of said plurality of phased clock signals and a separate prebias output signal in response to concurrent assertion of said second enable signal and a prebias input signal, wherein said even and odd phase cell are connected to form a ring having odd phase cells interposed between even phase cells, the prebias output signal produced by each odd phase cell is provided as the prebias input signal to a next even phase cell of the ring, and the prebias output signal produced by each even phase cell is provided as the prebias input signal to a next odd phase cell of the ring, and wherein at least one of said even and odd phase cells comprises first means for asserting a control signal in response to concurrent assertion of a prebias input signal to said cell and an enable signal and in response to concurrent assertion of the enable signal and a feedback signal, and second means for asserting the feedback signal, the phased clock, and a prebias output signal when said control signal is asserted.

2. A multiple phase clock generator for producing a plurality of phased clock signals in response to a master clock signal and a reset signal, the multiple phase clock generator comprising:

enabling means for alternatively asserting a first and a second enable signal in response to changes in state of said master clock signal, said enabling means including means for deasserting both said first and second enable signals in response to assertion of the reset signal;

a plurality of odd phase cells each asserting a separate one of said plurality of phased clock signals and a separate prebias output signal in response to concurrent assertion of said first enable signal and a prebias input signal; and a plurality of even phase cells each asserting a separate one of said plurality of phased clock signals and a separate prebias output signal in response to concurrent assertion of said second enable signal and a prebias input signal, wherein said even and odd phase cells are connected to form a ring having odd phase cells interposed between even phase cells, the prebias output signal produced by each odd phase cell is provided as the prebias input signal to a next even phase cell of the ring, and the prebias output signal produced by each even phase cell is provided as the prebias input signal to a next odd phase cell of the ring, and wherein at least one of said even and odd phase cells comprises first means for asserting a control signal in response to concurrent assertion of a prebias input signal to said cell and an enable signal and in response to concurrent assertion of the enable signal and a feedback signal, and second means for asserting the feedback, signal, the phased clock, and a prebias output signal when said control signal is asserted.

3. A multiple phase clock generator for producing a plurality of phased clock signals in response to a master clock signal, the multiple phase clock generator comprising:
 means for producing a first current;
 switch means responsive to the master clock signal for alternately providing the first current as an asserted first enable signal and an asserted second enable signal;
 a plurality of odd phase cells each producing one of said plurality of phased clock signals, a separate prebias output signal, and a separate feedback signal, each of the odd phase cells comprising:
  first means for asserting a control signal in response to concurrent assertion of the first enable signal and a prebias input signal, and in response to concurrent assertion of the first enable signal and its feedback signal; and
  second means for asserting the feedback signal, the prebias output signal and the phased clock signal when the control signal is asserted; and
 a plurality of even phase cells each producing one of said plurality of phased clock signals, a separate prebias output signal, and a separate feedback signal, each of the odd phase cells comprising:
  first means for asserting a control signal in response to concurrent assertion of the second enable signal and a prebias input signal, and in response to concurrent assertion of the second enable signal and its feedback signal; and
  second means for asserting the feedback signal, the prebias output signal and the phased clock signal when the control signal is asserted,
 said even and odd phase cells being connected to form a ring wherein the prebias output signal produced by each odd phase cell is provided as the prebias input signal to a next even phase cell of the ring, and the prebias output signal produced by each even phase cell is provided as the prebias input signal to a next odd phase cell of the ring.

4. A multiple phase clock generator in accordance with claim 3, wherein said switch means comprises:
 a first transistor having a first terminal for providing the first enable signal, a second terminal, and a third terminal connected to said means for producing the first current; and
 a second transistor having a first terminal for providing the second enable signal, a second terminal, and a third terminal connected to said means for producing the first current,
 wherein the master clock signal is applied across the second terminals of the first and second transistors such that a first state of the master clock signal causes the first transistor to conduct the first current and a second state of the master clock signal causes the second transistor to conduct the first current.

5. A phase cell for producing a phased clock signal comprising:
 first means for asserting a control signal in response to concurrent assertion of a prebias input signal to said cell and an enable signal, and in response to concurrent assertion of the enable signal and a feedback signal; and
 second means for asserting the feedback signal, the phased clock, and a prebias output signal when said control signal is asserted.

6. A phase cell in accordance with claim 5, wherein said second means comprises a transistor having a base, a collector and at least three emitters, said control signal being applied to said base and the feedback, phased clock and prebias output signals each being produced at a separate one of said three emitters.

7. A phase cell in accordance with claim 5, wherein the enable signal is a current signal and wherein said first means comprises:
 a source of supply voltage;
 a first resistor; and
 a first transistor having a first terminal coupled through said resistor to said source of supply voltage, a second terminal receiving the enable signal, and a third terminal receiving the prebias input signal and the feedback signal such that said enable signal is conducted through said resistor when said enable signal and one of said feedback and prebias input signals are asserted, thereby producing a first voltage at said first terminal of a magnitude determined by whether said first resistor is conducting said enable signal.

8. A phase cell in accordance with claim 7, wherein said first means further comprises:
 a source of reference voltage; and
 comparator means for asserting and deasserting said control signal in accordance with a comparison of said first voltage and said reference voltage.

9. A multiple phase clock generator comprising:
 a ring of phase cells, each phase cell asserting a separate phased clock output signal and a separate prebias output signal in response to concurrent assertion of an enable input signal and a prebias output signal from a preceding phase cell on the ring; and
 means for supplying enable signals to each phase cell around the ring, said enable signals being asserted and deasserted in response to state changes in a master clock signal, enable signals supplied to nonadjacent phase cells being asserted concurrently such that only one phase cell asserts its phased clock output signal at a time and such that each transition of the master clock signal causes a next phase cell on the ring to assert its phased clock output signal,
 wherein at least one of said phase cells comprises first means for asserting a control signal in response to concurrent assertion of a prebias input signal to said cell and an enable signal and in response to concurrent assertion of the enable signal and a feedback signal, and second means for asserting the feedback signal, the phased clock, and a prebias output signal when said control signal is asserted.

10. A multiple phase clock generator in accordance with claim 9 wherein said ring of phase cells includes an even number of phase cells.

11. A multiple phase clock generator for producing a plurality of phased clock signals in response to a master clock signal, the multiple phase clock generator comprising:
enabling means for alternatively asserting a first and a second enable signal in response to changes in state of said master clock signal;
a plurality of odd phase cells each providing a separate one of said plurality of phased clock signals and a separate prebias output signal in response to concurrent assertion of said first enable signal and a prebias input signal; and
a plurality of even phase cells each providing a separate one of said plurality of phased clock signals and a separate prebias output signal in response to concurrent assertion of said second enable signal and a prebias input signal,
wherein one of said even and odd phase cells comprises:
first means for asserting a control signal in response to concurrent assertion of the prebias input signal to said cell and one of said first and second enable signals, and in response to concurrent assertion of said one enable signal and a feedback signal; and
second means for asserting the feedback signal, and the phased clock and prebias output signals of said cell when said control signal is asserted,
wherein said even and odd phase cells are connected to form a ring having odd phase cells interposed between even phase cells,
wherein the prebias output signal produced by each odd phase cell is provided as the prebias input signal to a next even phase cell of the ring, and
wherein the prebias output signal produced by each even phase cell is provided as the prebias input signal to a next odd phase cell of the ring.

12. A multiple phase clock generator in accordance with claim 11, wherein said second means comprises a transistor having a base, a collector and at least three emitters, said control signal being applied to said base, said feedback, phased clock and prebias output signals each being produced at a separate one of said three emitters.

13. A multiple phase clock generator in accordance with claim 11, wherein said one enable signal is a current signal and wherein said first means comprises:
a source of supply voltage:
a first resistor; and
a first transistor having a first terminal coupled through said resistor to said source of supply voltage, a second terminal receiving the enable signal, and a third terminal receiving the prebias input signal and the feedback signal such that said enable signal is conducted through said resistor when said enable signal and one of said feedback and prebias input signals are asserted, thereby producing a first voltage at said first terminal of a magnitude determined by whether said first resistor is conducting said enable signal.

14. A multiple phase clock generator in accordance with claim 13, wherein said first means further comprises:
a source of reference voltage; and
comparator means for asserting and deasserting said control signal in accordance with a comparison of said first voltage and said reference voltage.

15. A multiple phase clock generator in accordance with claim 13, wherein the first and second enable signals are current signals and said enabling means comprises:
means for producing a first current; and
switch means responsive to said master clock signal and a reset signal for alternately directing said first current to said odd and even phase cells as asserted first and second enable signals when the reset signal is deasserted, and for directing said first current to said one phase cell as an asserted initialize signal when the reset signal is asserted,
wherein the initialize signal is applied at said terminal of said first transistor of said one phase cell.

16. A multiple phase clock generator for producing a plurality of phased clock signals in response to a master clock signal, the multiple phase clock generator comprising:
means for producing a first current;
switch means responsive to said master clock signal for alternately directing said first current as asserted first and second enable signals;
a plurality of odd phase cells each providing a separate one of said plurality of phased clock signals and a separate prebias output signal in response to concurrent assertion of said first enable signal and a prebias input signal; and
a plurality of even phase cells each providing a separate one of said plurality of phased clock signals and a separate prebias output signal in response to concurrent assertion of said second enable signal and a prebias input signal,
wherein said even and odd phase cells are connected to form a ring having odd phase cells interposed between even phase cells,
wherein the prebias output signal produced by each odd phase cell is provided as the prebias input signal to a next even phase cell of the ring, and
wherein the prebias output signal produced by each even phase cell is provided as the prebias input signal to a next odd phase cell of the ring.

17. A multiple phase clock generator in accordance with claim 16, wherein said switch means comprises:
a first transistor having a first terminal for providing the first enable signal, a second terminal, and a third terminal connected to said means for producing the first current; and
a second transistor having a first terminal for providing the second enable signal, a second terminal, and a third terminal connected to said means for producing the first current,
wherein the master clock signal is applied across the second terminals of the first and second transistors such that a first state of the master clock signal causes the first transistor to conduct the first current and a second state of the master clock signal causes the second transistor to conduct the first current.

18. A multiple phase clock generator for producing a plurality of phased clock signals in response to a master clock signal and a reset signal, the multiple phase clock generator comprising:
means for producing a first current;
switch means responsive to said master clock signal and said reset signal for alternately directing said first current as asserted first and second enable signals when the reset signal is deasserted, and for deasserting the first and second enable signals when the reset signal is asserted;

a plurality of odd phase cells each asserting a separate one of said plurality of phased clock signals and separate prebias output signal in response to concurrent assertion of said first enable signal and a prebias input signal; and a plurality of even phase cells each asserting a separate one of said plurality of phased clock signals and a separate prebias output signal in response to concurrent assertion of said second enable signal and a prebias input signal, wherein said even and odd phase cells are connected to form a ring having odd phase cells interposed between even phase cells, wherein the prebias output signal produced by each odd phase cell is provided as the prebias input signal to a next even phase cell of the ring, and wherein the prebias output signal produced by each even phase cell is provided as the prebias input signal to a next odd phase cell of the ring.

* * * * *